United States Patent [19]
Nelson

[11] 4,283,776
[45] Aug. 11, 1981

[54] ION-IMPLANTED MAGNETIC BUBBLE MEMORY

[75] Inventor: Terence J. Nelson, New Providence, N.J.

[73] Assignee: Bell Telephone Laboratories, Incorporated, Murray Hill, N.J.

[21] Appl. No.: 99,554

[22] Filed: Dec. 3, 1979

[51] Int. Cl.³ .............................................. G11C 19/08
[52] U.S. Cl. ........................................ 365/36; 365/15
[58] Field of Search ........................ 365/15, 36, 41, 13

[56] References Cited
U.S. PATENT DOCUMENTS 4,040,019  8/1977  Bullock .................................. 365/41

OTHER PUBLICATIONS

IBM Technical Disclosure Bulletin-vol. 17, No. 7, Dec. 1974, pp. 2196–2197.
Journal of Vacuum Science & Technology-vol. 15, No. 5, Sep./Oct. 1978, pp. 1675–1684.

Primary Examiner—James W. Moffitt
Attorney, Agent, or Firm—Herbert M. Shapiro

[57] ABSTRACT

A gap between sets of contiguous discs defined by nonimplanted regions in an otherwise ion-implanted bubble layer allows an isolation between bubbles which leads to the achievement surprisingly close spacing between neighboring bubble paths. The misalignment of the gap axis with an axis of symmetry of the bubble layer is an important consideration in realizing the isolation.

7 Claims, 6 Drawing Figures

ION-IMPLANTED MAGNETIC BUBBLE MEMORY

FIELD OF THE INVENTION

This invention relates to magnetic bubble memories, and more particularly, to such memories in which bubbles move along paths defined by patterns of ion-implanted regions.

BACKGROUND OF THE INVENTION

Magnetic bubble memories are well known in the art. One mode of operating such memories is called a field access mode as is also well known. A field access mode bubble memory is characterized by a magnetic field reorienting, typically rotating, in the plane of bubble movement. Bubbles, in response to the cyclical changes in the magnetic field move along paths defined by magnetically soft elements such as permalloy or, more recently, by a repetitive pattern of ion-implanted regions.

The most attractive organization for a field access bubble memory is called the major-minor organization. This organization includes a plurality of closed-loop paths, termed minor loops, and a single major path or loop. A bubble generator and a bubble detector are associated with the major path in spaced-apart positions operative to produce a bubble pattern in the major path and to detect such a pattern respectively.

Movement in all the paths is produced by the rotating magnetic field. Bubble movements in the minor loops and the major path thus are synchronous. Accordingly, bubble movement between the minor loops and the major path is achieved by the generation of appropriate magnetic control fields during a selected cycle of the magnetic field.

Commonly, the control fields are generated at the ends of the minor loops where those loops come into close proximity with the major path. At those ends, the geometries of the ion-implanted regions, for example, are different and an electrical conductor is coupled to the layer of bubble movement at the positions of close proximity so that bubbles can be moved between the minor loops and the major path by a pulse on the conductor during a selected cycle.

Frequently, a separate conductor couples positions of close proximity between minor loops and the major path at each set of ends of the minor loops. The elements and conductors at one set of ends are adapted to transfer bubble patterns into the minor loops; those at the other set of ends being adapted to transfer bubble patterns out of the minor loops. It can be seen that bubbles from the generator are organized in the major path for transfer into the minor loops for permanent storage while bubbles permanently stored in the minor loops are transferred out to the major loop for detection all in response to the rotating magnetic field and appropriately timed transfer-in and transfer-out pulses.

Whatever the organization, a transfer port is important and, of course, optimization of operating margins of such a transfer is highly desirable also. For such optimization, it is helpful to bring as close together as possible the two paths between which transfer is to occur. But a rule-of-thumb in bubble memory design is that adjacent bubbles are to be spaced apart four to five bubble diameters. This constraint dictates typical spacings in bubble memory design. The problem thus is to achieve a functional bubble operation such as transfer between paths closer than the rule-of-thumb dictates.

The solution to this problem is based on the use of worse-case orientation for the merge port disclosed in copending application Ser. No. 99,556 filed for T. J. Nelson and R. Wolfe (Case 13–18).

BRIEF DESCRIPTION OF THE ILLUSTRATIVE EMBODIMENT

A bubble memory herein includes illustratively, a plurality of transfer-in ports in which one set of ends of the minor loops of the memory are spaced apart by a gap of only about one or two bubble diameters from associated stages of the major loop. The gap has an axis which is oriented preferably at 90 degrees with respect to one axis of preferred bubble positions in the layer in which magnetic bubbles are moved. Such an axis of preferred bubble positions aligns with an axis of symmetry characteristic of cubic crystals typical of such a layer. Such a 90 degree orientation can be thought of as the worse-case orientation for a merge port disclosed in the above-mentioned application because for the merge port the gap axis and the axis of symmetry are aligned to insure that bubbles entering the gap from one of two paths exits on a single path. Such a merge function is best achieved with an aligned gap axis. The characterizing feature of the present invention thus is that the worse-case orientation (i.e., about 90 degree misalignment) insures that the two entrance paths are isolated so that close spacings can be achieved.

DETAILED DESCRIPTION

Figure 1:
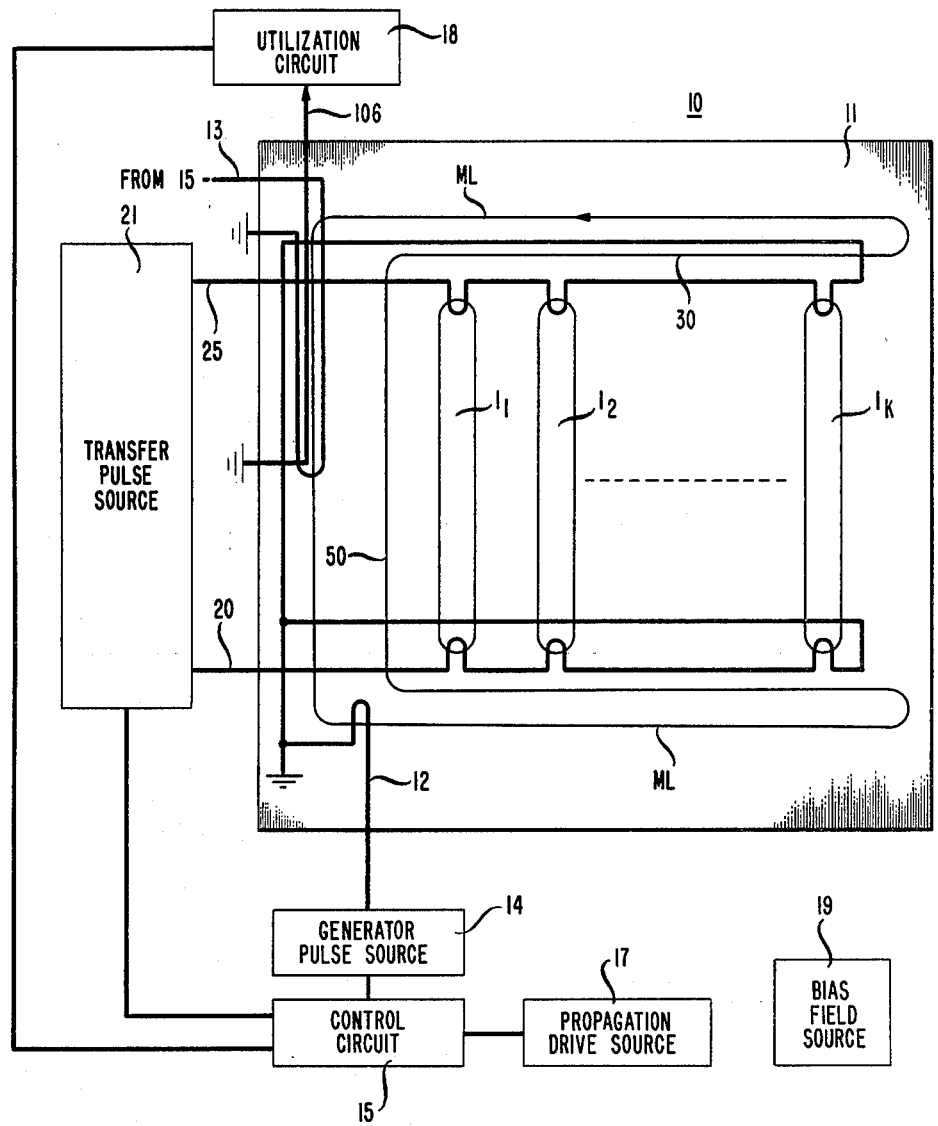
FIG. 1 is a block diagram of an illustrative memory in accordance with this invention.

FIG. 1 shows a magnetic bubble memory 10 of the type disclosed in copending application Ser. No. 18,310 of T. M. Burford filed Mar. 3, 1979. The memory includes a host layer 11 of a material in which magnetic bubbles can be moved. Bubbles are moved in layer 11 in closed loops, $l_1$, $l_2$—and $l_k$, the minor loops, and a single loop ML the major loop. In the illustrative embodiment, loop ML is folded into the G-shaped (actually a U-shaped) configuration.

Permanent storage of data is provided by the minor loops. The major loop, on the other hand, provides for access to the minor loops of substitute data from a bubble generator and for read out of addressed data at a detector. In this connection the generator comprises an electrical conductor 12 connected between a generator pulse source 14 and ground operative under the control of control circuit 15 to provide a pulse selectively during each cycle of a propagate drive circuit represented by block 17. The detector similarly comprises, for example, a conductor shown connected between a utilization circuit 18 and ground.

Bubbles are maintained at a nominal diameter by a bias field supplied by source 19.

We will adapt the convention that data, generated at 12, move counterclockwise about loop ML to locations at the lower ends of the minor loops in response to successive propagation cycles. A transfer-in electrical conductor 20 couples those ends of the minor loops with associated stages of the major loop for transferring new data into the minor loops at the proper time. Conductor 20, to this end, is connected between a transfer pulse source 21 and ground as shown.

A similar transfer operation, termed a transfer-out operation occurs at the top ends of the minor loops as viewed. The transfer-out operation is controlled by a pulse in electrical conductor 25 which is similarly connected between pulse source 21 and ground. The control of the transfer function as well as the generator, propagation and detector operation is derived from a master clock in accordance with well understood principles. Such circuitry along with an address register is considered to be included within control circuit 15.

The transfer-out operation moves addressed data from the minor loops into an auxiliary propagation path 30. From that path data transfers in parallel to associated stages in the major loop as is disclosed in copending application Ser. No. 99,552 of P. I. Bonyhard and T. J. Nelson (Case 28-12) filed on even date herewith. It is to be recognized that no data propagation occurs in path 30 during a read operation.

Figure 2:
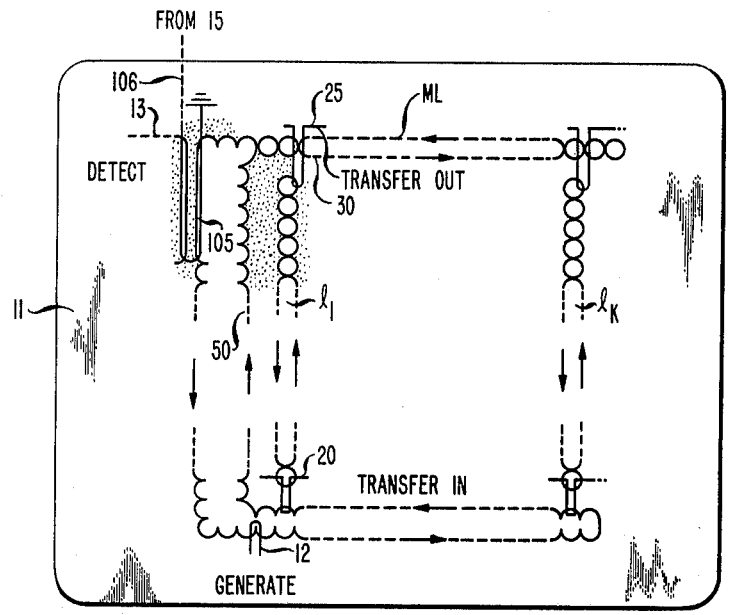
FIGS. 2, 3, 4, 5, and 6 show schematic top views of portions of the ion-implanted pattern of the memory of FIG. 1.

Data, so transferred, move first to the left, then downward, then to the right thereafter to enter a transfer-in portion of the major loop from the right as viewed in the figure. FIG. 2 shows a schematic top view of nonimplanted islands, in an otherwise ion-implanted surface, for implementing the organization of FIG. 1. The transfer-in and transfer-out sections are marked with arrows showing the direction of bubble movement. The major "loop" to this point is seen to have a U-shaped configuration the loop being completed by a portion 50 which connects the left end of the transfer in positions to path 30 as shown in FIG. 1 thus allowing the operation of the memory essentially as described in the above-mentioned copending application of T. M. Burford.

The general organization of the memory of FIG. 1 thus can be seen to involve the generation of a bubble pattern at 12 for later storage in the minor loops by the activation of transfer conductor 20 during a write operation. Also involved is the transfer-out of addressed data from the minor loops by the activation of transfer-out conductor 25. The data transferred out advances to the detector for applying signals representative of bubble patterns to utilization circuit 18. The data moves counterclockwise along loop ML until a later transfer-in operation occurs. This later transfer-in operation moves the data back into vacancies at the bottom of the minor loops as viewed.

In this connection, it is helpful to recall that bubbles usually are moving synchronously in all the loops of the memory. When a transfer-out operation occurs, vacancies are left in the address bit locations in the minor loops. Those vacancies move about the minor loops as the transferred data moves to the detector. The number of stages in the minor loops and the number in the major loop are chosen so that data transferred out or data generated at 12 arrive at the lower end of the minor loops synchronously with those vacancies. It also should be recognized that the (double) transfer-out of data into the major loop, as described, rather than directly into path 30 for propagation ensures that the bits so transferred are in the proper sequence for a later transfer-in operation, the characteristic operation of the familiar G-shaped path. If the transfer-out operation resulted in direct transfer only to path 30, the bits would be reversed when transfer in next occurred thus necessitating, for example, a more complicated transfer-in operation.

Figure 3:
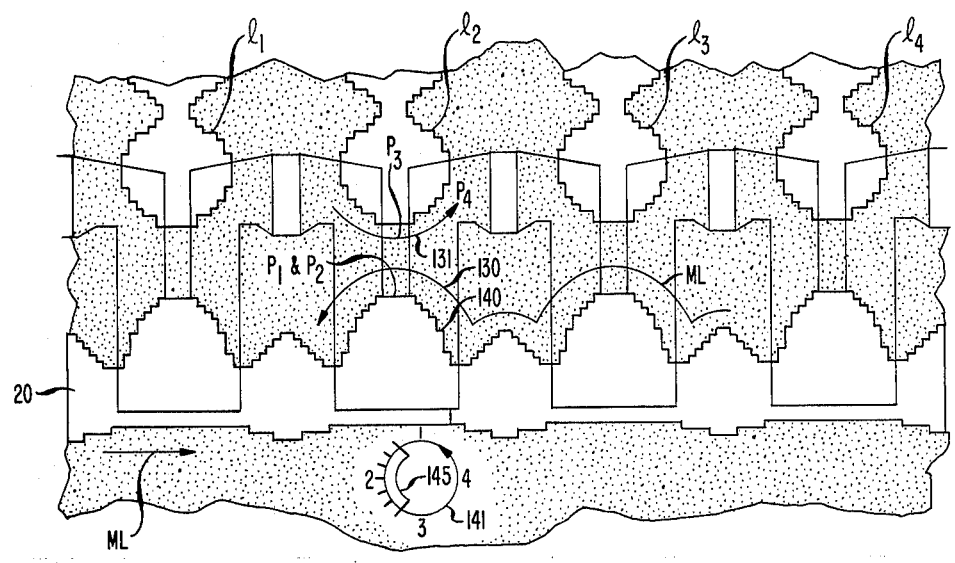
Figure 4:
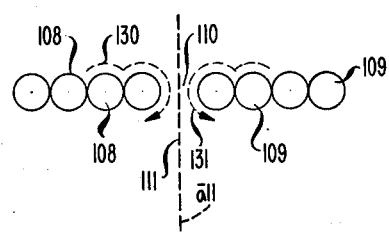
Figure 5:
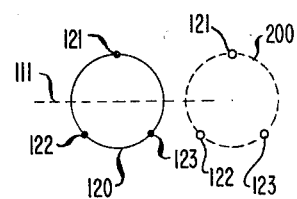

FIG. 3 shows an enlarged top view of a transfer-in implementation for moving a bubble pattern in the major loop back into those originating vacancies. The organization of the ion-implanted regions is designed to take advantage of a "worst case" orientation, with respect to the crystallagraphic orientation of host layer 11. The term "worst case" is used for comparison with a "best case" orientation for achieving a merge operation as disclosed in copending application Ser. No. 99,556 filed Dec. 3, 1979 for T. J. Nelson-R. Wolfe (Case 13-18). The term applies to the orientation of the axis of a gap between, for example, two sequences of periodic nonimplanted patterns. Such an arrangement may be implemented as first and second sets of contiguous discs 108 and 109 separated by a gap 110 with an axis 111 as shown in FIG. 4 aligned with crystallographic axis 211. FIG. 4 shows imaginary first and second sets of discs aligned with the orientations of preferred bubble positions which correspond to the axes of symmetry of the cubic garnet crystal of host layer 11. FIG. 5 shows one of those discs 120 with preferred positions 121, 122, and 123 shown thereabout. These positions are 120 degrees apart. The above-mentioned application of Nelson and Wolfe discloses a merge port where axis 111 of FIG. 4 aligns with a position corresponding to position 121 herein. The present transfer-in port of FIG. 3 is operative when axis 111 is radially displaced 90 degrees from position 121 (or 122 or 123) as shown in FIG. 5. Such an orientation ensures maximum independence between bubbles moving in paths 130 and 131 of FIG. 4 even when gap 110 is reduced to one or two bubble diameters rather than the more typical spacing of more than four bubble diameters between a minor loop and the associated stage of the major loop.

With this choice of orientations in mind we can return to FIG. 3 where path 130 of FIG. 4 can be taken to correspond to the bubble path of major loop ML and path 131 of FIG. 4 can be taken to correspond to the path of minor loop $l_2$. Minor loops $l_1$–$l_4$ are shown in FIG. 3 with alternative bulges having peaks which protrude towards the end discs of the associated minor loops. The basic period of the implant pattern is four to five bubble diameters. The spacing between positions $P_1$ and $P_3$ can be seen to be about one half the period of the pattern or about equal to two bubble diameters. Smaller spacings have been obtained. Notice, from FIGS. 1, 2 and 3 that data in the portion of the major loop closer to the lower ends of the minor loops, as viewed in the figures, moves from right to left as shown in FIG. 3.

During a transfer-in cycle, a bubble arrives at position $P_1$, at the peak of a bulge 140 associated with minor loop $l_2$. As the in-plane field reorients as indicated by the curved arrow 141 in FIG. 3, a transfer-in pulse is applied to conductor 20, of FIG. 1, by source 21. The pulse is of a duration to last until the in-plane field almost reorients to 3 as shown by the bracket 145 in FIG. 3. At the termination of the transfer-in pulse, the bubble is in position $P_3$ at the bottom of minor loop $l_2$. The bubble moves (along path 131) to position $P_4$ as the in-plane field rotates further counterclockwise to a 4 orientation. Of course, the entire bubble pattern in the major loop is transferred-in, similarly, to the vacancies positioned in position $P_3$ in all the minor loops. Consequently, data transferred-out into the major loop and detected is now transferred back into minor loops completing a read operation.

The three dots 121, 122, and 123 of FIG. 5 represent, also, the three-fold symmetry which characterized the cubic crystalline structure common to bubble materials as has been mentioned hereinbefore. The nonalignment of axis 111, the gap axis, and one of the three-fold axes makes the gap look least like a nonimplanted region. No preferred positions are paired as is the case where a merge port is defined. The difference between the merge port and the isolation port herein is appreciated from a comparison between FIG. 5 and FIG. 6. In FIG. 5 a broken circle 200 represents a next adjacent disc with respect to disc 120. Preferred positions 121, 122 and 123 are shown with respect to both discs. It is clear that preferred positions 123 and 122 are paired resulting in a different path being taken by two bubbles one entering the gap between discs 120 and 200 from the top and one from the bottom as viewed.

Figure 6:
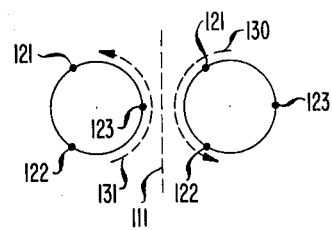

In FIG. 6, axis 111 has a position 123 to the left, as viewed, and positions 121 and 122 to the right, no preferred position is reinforced (paired) as is the case with the merge. Rather, a succession of preferred positions occurs in paths 130 and 131 to provide a succession of relatively large attracting poles to bubbles and thus allowing the surprisingly close spacings to be achieved herein.

Moreover, for the preferred mode herein, the gap 110 has a width w about as wide as the mean bubble diameter d in layer 11. For a 1.7 micron diameter bubble, a disc has a diameter of 8 microns and gap 110 is typically 3 microns (equal to the minimum bubble diameter at low bias). If the gap is less than about 1 micron, the circuit acts like no gap exists.

The foregoing embodiment is considered merely illustrative of the principles of this invention. Accordingly, various modifications thereof can be devised by those skilled in the art in accordance with those principles within the spirit and scope of the invention as encompassed by the following claims.

I claim:

1. A magnetic bubble memory comprising a host layer of magnetic material in which magnetic bubbles can be moved along first and second paths in response to a magnetic field reorienting in the plane of said layer, a pattern of nonimplanted regions in said host layer for defining said paths in implanted regions thereabout, said nonimplanted regions defining first and second sets of periodic elements and an implanted gap separating said sets wherein said host layer has a three-fold axis of symmetry said memory being CHARACTERIZED IN THAT said gap has an axis aligned at about 90 degrees with respect to one of said axes of symmetry for permitting a relatively small gap to be achieved.

2. A magnetic bubble memory in accordance with claim 1 wherein said sets comprise contiguous discs.

3. A magnetic bubble memory in accordance with claim 1 or 2 in which said bubbles have a mean diameter d and said gap has a width $$w \approx d.$$

4. A magnetic bubble memory in accordance with claim 3 wherein said memory comprises a plurality of minor loops having first ends each defining one of said first paths, said memory also including a major loop defining said second path.

5. A magnetic bubble memory in accordance with claim 4 wherein said major path includes alternate elements associated with said first ends wherein said alternate elements are of an enlarged geometry to form said gap with said ends.

6. A magnetic bubble memory in accordance with claim 5 also comprising signal means including an electrical conductor coupling electrically in series consecutive ones of said ends and associated ones of said alternate elements for transferring bubbles therebetween when pulsed.

7. A magnetic bubble memory in accordance with claim 6 wherein said signal means also includes means for pulsing said electrical conductor.

* * * * *